United States Patent
Wu

(10) Patent No.: US 7,782,102 B2
(45) Date of Patent: Aug. 24, 2010

(54) POWER-ON RESET CIRCUIT AND ELECTRONIC DEVICE USING THE SAME

(75) Inventor: Chun-Te Wu, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/353,974

(22) Filed: Jan. 15, 2009

(65) Prior Publication Data
US 2009/0268493 A1    Oct. 29, 2009

(30) Foreign Application Priority Data
Apr. 28, 2008   (CN)   ............ 2008 2 0300643

(51) Int. Cl.
*H03L 7/00* (2006.01)
(52) U.S. Cl. .............................. 327/143; 327/198
(58) Field of Classification Search ............ 327/142, 327/143, 198
See application file for complete search history.

(56) References Cited

U.S. PATENT DOCUMENTS

| | | | |
|---|---|---|---|
| 3,337,742 A * | 8/1967 | Baehr et al. | 307/64 |
| 4,611,126 A | 9/1986 | Miller | |
| 5,394,104 A * | 2/1995 | Lee | 327/143 |
| 6,407,598 B1 * | 6/2002 | Ogane | 327/143 |
| 2004/0217785 A1 * | 11/2004 | Colbeck et al. | 327/142 |
| 2007/0103210 A1 * | 5/2007 | Hsu | 327/143 |

* cited by examiner

*Primary Examiner*—Lincoln Donovan
*Assistant Examiner*—William Hernandez
(74) *Attorney, Agent, or Firm*—Frank R. Niranjan

(57) ABSTRACT

A power-on reset circuit connected to an external DC power source includes a delay circuit, a rectifying circuit, and a logic operation circuit. The delay circuit includes a first delay unit used for outputting a first delaying reference signal and a second delay unit used for outputting a second delaying reference signal. The rectifying circuit connected to the delay circuit includes a first rectifying unit and a second rectifying unit. The first rectifying unit is connected to the first delay circuit used for rectifying the first delaying reference signal to output a first rectified signal. The second rectifying unit is connected to the second delay circuit used for rectifying the second delaying reference signal to output a second rectified signal. The logic operation circuit is connected to the rectifying circuit used for outputting a reset signal according to the first rectified signal and the second rectified signal.

12 Claims, 5 Drawing Sheets

POWER-ON RESET CIRCUIT AND ELECTRONIC DEVICE USING THE SAME

BACKGROUND

1. Technical Field

Embodiments of the present disclosure relate to consumer electronic devices, and particularly to a power-on reset circuit and an electronic device using the same.

2. Description of Related Art

Generally, functional chips employed by electronic products, such as central processing units (CPUs), flash memory, and application specific integrated circuits (ASICs), need to be reset when powered-on. In most conventional applications, specific reset chips, or microcontrollers, such as complex programmable logic devices (CPLDs), and field-programmable gate array (FPGA), are employed for providing reliable reset signals.

FIG. 4 shows one such power-on reset circuit for generating reset signals for a CPU 120, a flash memory 121, and an ASIC 122 after being powered-on. The power-on reset circuit includes a direct current (DC) power source 10 and a reset chip 11. The DC power source 10 outputs a DC signal to the reset chip 11, and the reset chips 11 then processes the DC signal to generate a reset signal to reset the CPU 120, the flash memory 121 and the ASIC 122.

FIG. 5 shows another power-on reset circuit for generating reset signals for a CPU 220, a flash memory 221, and an ASIC 222 after powered-on. This power-on reset circuit includes a DC source 20 and a micro-controller 21. The DC power source 20 outputs a DC signal to the micro-controller 21, and the micro-controller 21 then processes the DC signal to generate a reset signal to reset the CPU 220, the flash memory 221 and the ASIC 222.

The power-on reset circuits, as described above, need the special reset chips or micro-controllers to provide reset signals. That is, the power-on reset circuits need one additional chip to generate the reset signals. Parameters of the additional chip are set by chip manufacturers, and are difficult to adjust. Therefore, the power-on reset circuits have poor flexibility and inevitably increase costs.

DETAILED DESCRIPTION OF CERTAIN INVENTIVE EMBODIMENTS

Figure 1:
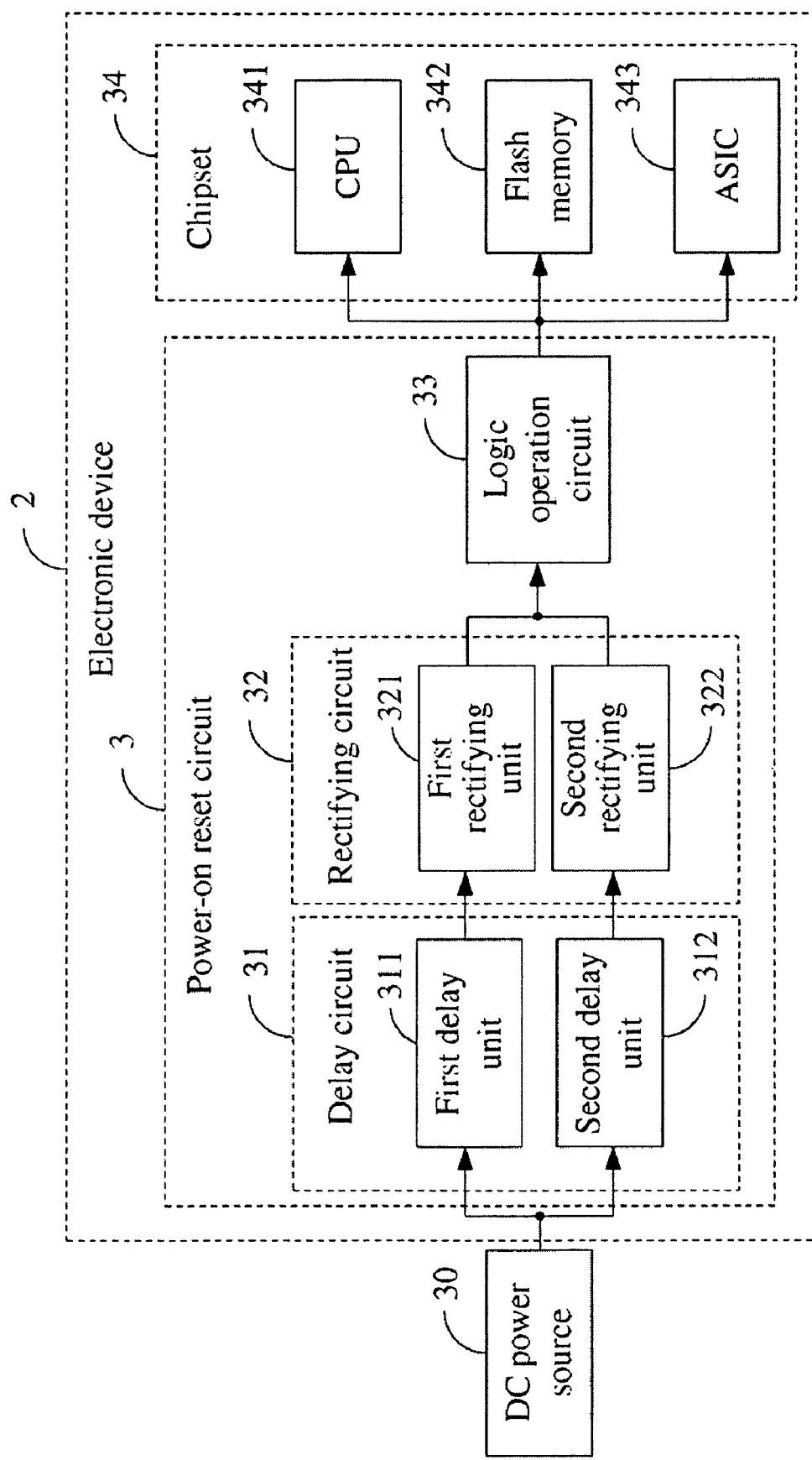
FIG. 1 is a block diagram of a power-on reset circuit of one embodiment of the present disclosure.

FIG. 1 is a block diagram of one embodiment of an electronic device 2 of the present disclosure. The electronic device 2 comprises a power-on reset circuit 3 and a chipset 34. The power-on reset circuit 3 is connected to and receives a power signal from an external direct circuit (DC) power source 30, and generates a reset signal to the chipset 34. In this embodiment, the power-on reset circuit 3 comprises a delay circuit 31, a rectifying circuit 32, and a logical operation circuit 33. The delay circuit 31 comprises a first delay unit 311 and a second delay unit 312. The rectifying circuit 32 comprises a first rectifying unit 321 and a second rectifying unit 322. The chipset 34 comprises at least one functional chip, such as a central processing unit (CPU) 341, a flash memory 342 and/or an application specific integrated circuit (ASIC) 343.

The first delay unit 311 and the second delay unit 312 are connected in parallel to the DC power source 30. The first delay unit 311 is used for receiving a power signal output from the DC power source 30 and outputting a first delaying reference signal according to the received power signal. Similar to the first delay unit 311, the second delay unit 312 is used for receiving a power signal output from the DC power source 30 and outputting a second delaying reference signal according to the received power signal.

The first rectifying unit 321 is connected to the first delay unit 311 for rectifying the first delaying reference signal to a first rectified signal. The second rectifying unit 322 is connected to the second delay unit 312 for rectifying the second delaying reference signal to a second rectified signal. The first rectifying unit 321 and the second rectifying unit 322 are inverters with hysteresis, such as Schmit circuits, in accordance with the embodiments of the present disclosure.

The logical operation circuit 33 is connected to the rectifying circuit 32, namely simultaneously connected to the first rectifying unit 321 and the second rectifying unit 322, for performing logical operations on the first and second rectified signals and outputting a reset signal to the chipset 34.

Figure 2:
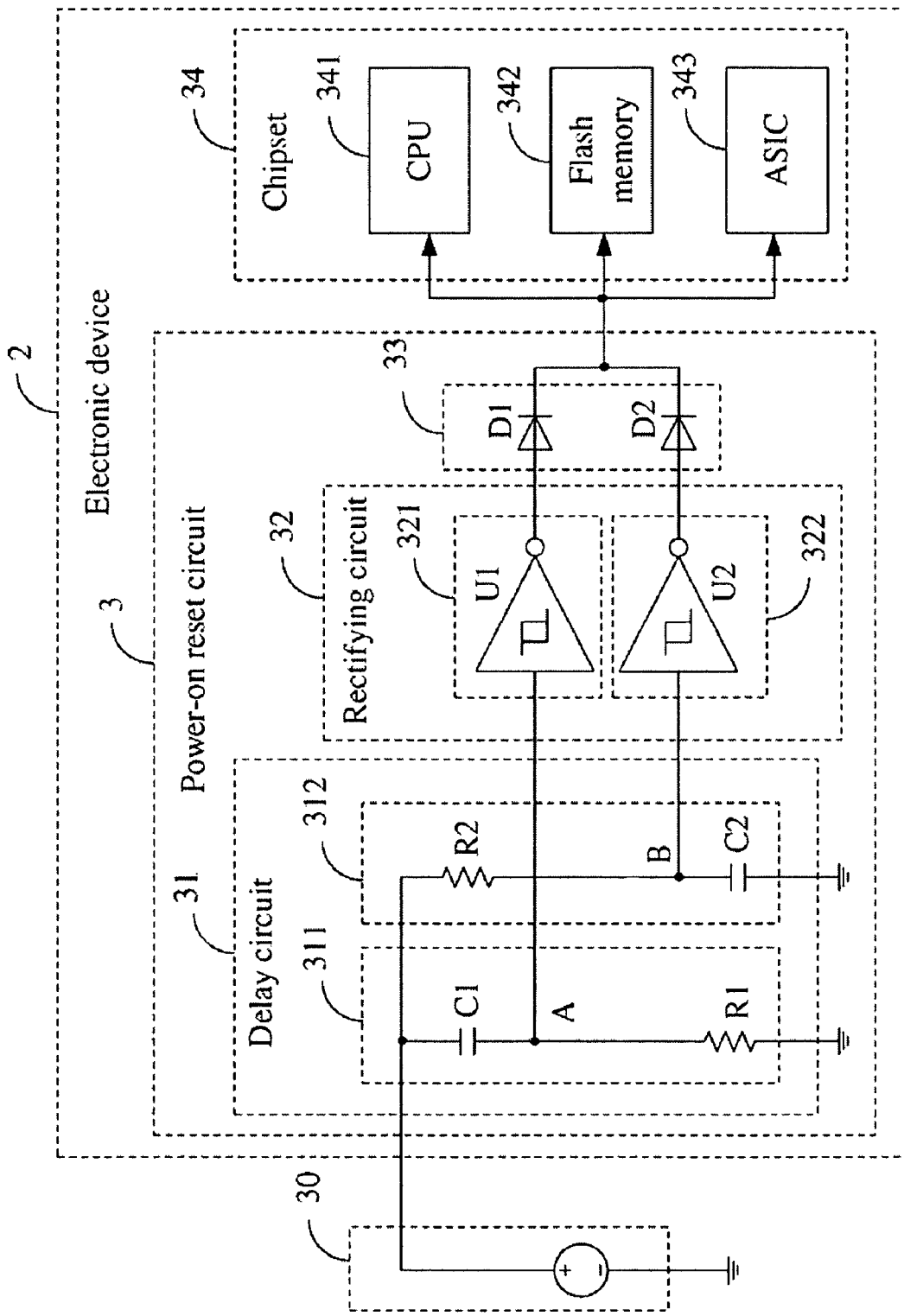
FIG. 2 is a detailed circuit diagram of one embodiment of FIG. 1.

FIG. 2 illustrates a detailed circuit diagram of one embodiment of the circuits of FIG. 1. The first delay unit 311 comprises a first capacitor C1 and a first resistor R1 connected in series between the external DC power source 30 and ground. The first capacitor C1 is charged by the power signal output from the DC power source 30. The second delay unit 312 comprises a second resistor R2 and a second capacitor C2, which are connected in series between the DC power source 30 and ground. The second capacitor C2 is charged by the power signal output from the DC power source 30.

In the power-on reset circuit 3 of the illustrated embodiment, all parameters of the first capacitor C1 and the first resistor R1 of the first delay unit 311, and the second capacitor C2 and the second resistor R2 of the second delay unit 312, can be adjusted and arranged according to practical requirements. Therefore, the delay time of the delay circuit 31 can be adjusted as needed.

The first rectifying unit 321 includes a first Schmitt circuit U1 and a second Schmitt circuit U2. The first Schmitt circuit U1 has a first input and a first output. The input of the first Schmitt circuit U1 is connected to a junction A of the first capacitor C1 and the first resistor R1, for receiving the first delaying reference signal. The output of the first Schmitt U1 is connected and outputs the first rectified signal to the logical operation circuit 33. The second rectifying unit 322 comprises a second Schmitt circuit U2 having a second output and a second input. The input of the second Schmitt circuit U2 is connected to a junction B of the second capacitor C2 and the second resistor R2, for receiving the second delaying reference signal. The output of the second Schmitt circuit U2 is connected and outputs the second rectified signal to the logical operation circuit 33.

In one exemplary example, the first Schmitt circuit U1 and the second Schmitt circuit U2 are Schmitt inverter triggers 74HC14, which output a low voltage signal when triggered, and output a high voltage signal when not triggered. In normal operation status, each of the first Schmitt circuit U1 and the second Schmitt circuit U2 have a high voltage level and a low voltage level. If an initial input voltage of the first Schmitt circuit U1 or the second Schmitt circuit U2 is higher than the high voltage level thereof, a trigger voltage thereof is the low voltage level. If the initial input voltage of the first Schmitt circuit U1 or the second Schmitt circuit U2 is lower than the low voltage level thereof, the trigger voltage is the high voltage level.

In one exemplary example, the high voltage levels of the first schmitt circuit U1 and the second schmitt circuit U2 are approximately 2.5-2.6V, and the low voltage levels are approximately 2.3-2.4V. However, it may be understood that these voltages may vary depending on the embodiment and the application of the power-on reset circuit 3.

In other embodiments, the first rectifying unit 321 and the second rectifying unit 322 can use a Schmitt trigger or an inverting Schmitt trigger according to different chip specifications, and can also be composed of discrete elements. Therefore, the rectifying parameters of the first rectifying unit 321 and the second rectifying unit 322 can be adjusted to adjust the trigger voltage thereof according to different requirements.

The logical operation circuit 33 comprises a first diode D1 and a second diode D2. An anode of the first diode D1 is connected to the output of the first Schmitt circuit U1 for receiving the first rectified signal. The cathode of the first diode D1 outputs a first logic signal. Accordingly, an anode of the second diode D2 is connected to the output of the second Schmitt circuit U2 for receiving the second rectified signal. The cathode of the second diode D2 outputs a second logic signal. In other embodiments, the logical operation circuit 33 can use different digital elements according to different chip specifications, such as an OR gate arithmetic unit or other logic gate elements.

Figure 3:
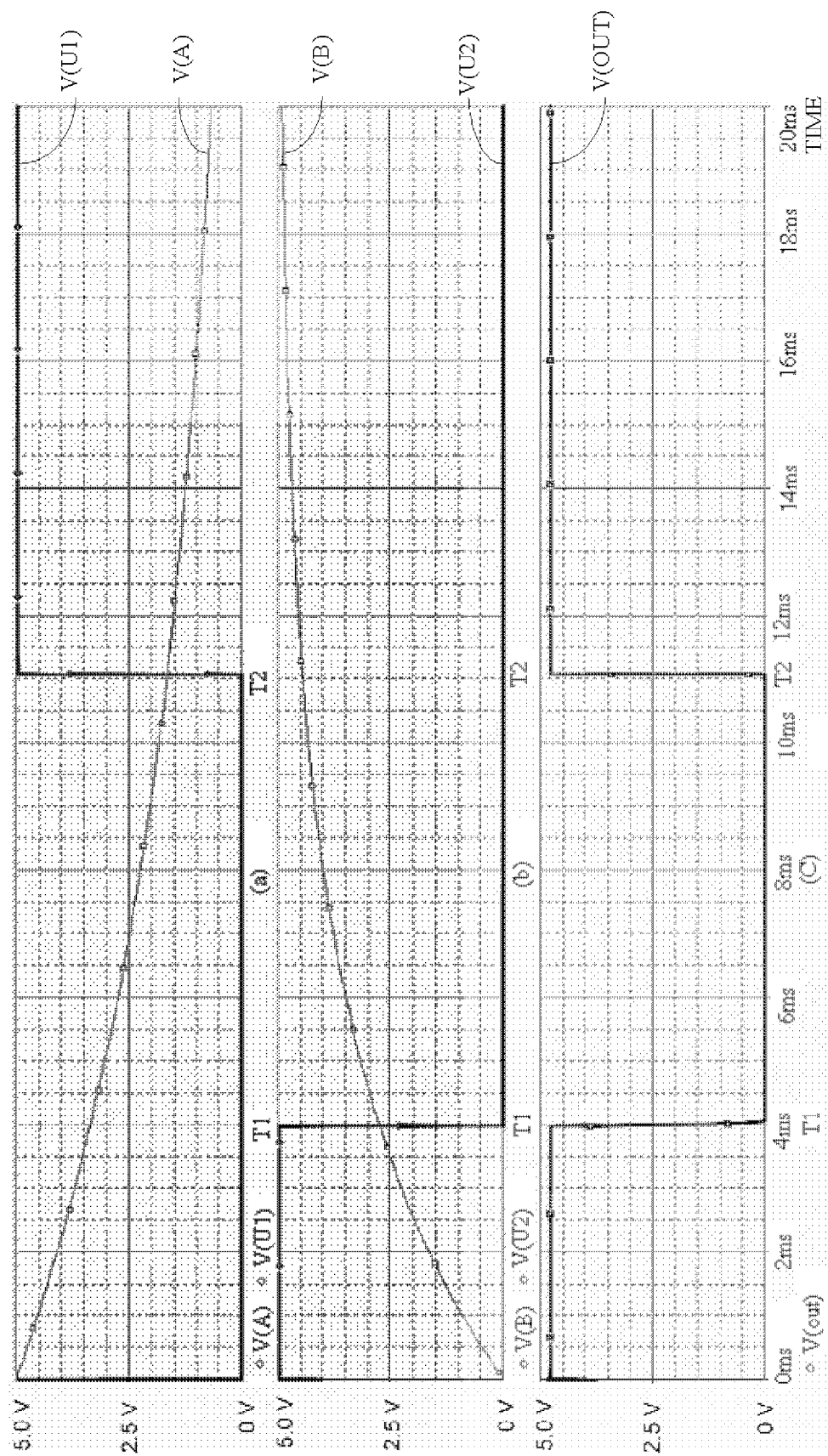
FIG. 3 is an exemplary signal waveform diagram of FIG. 2.
Figure 4:
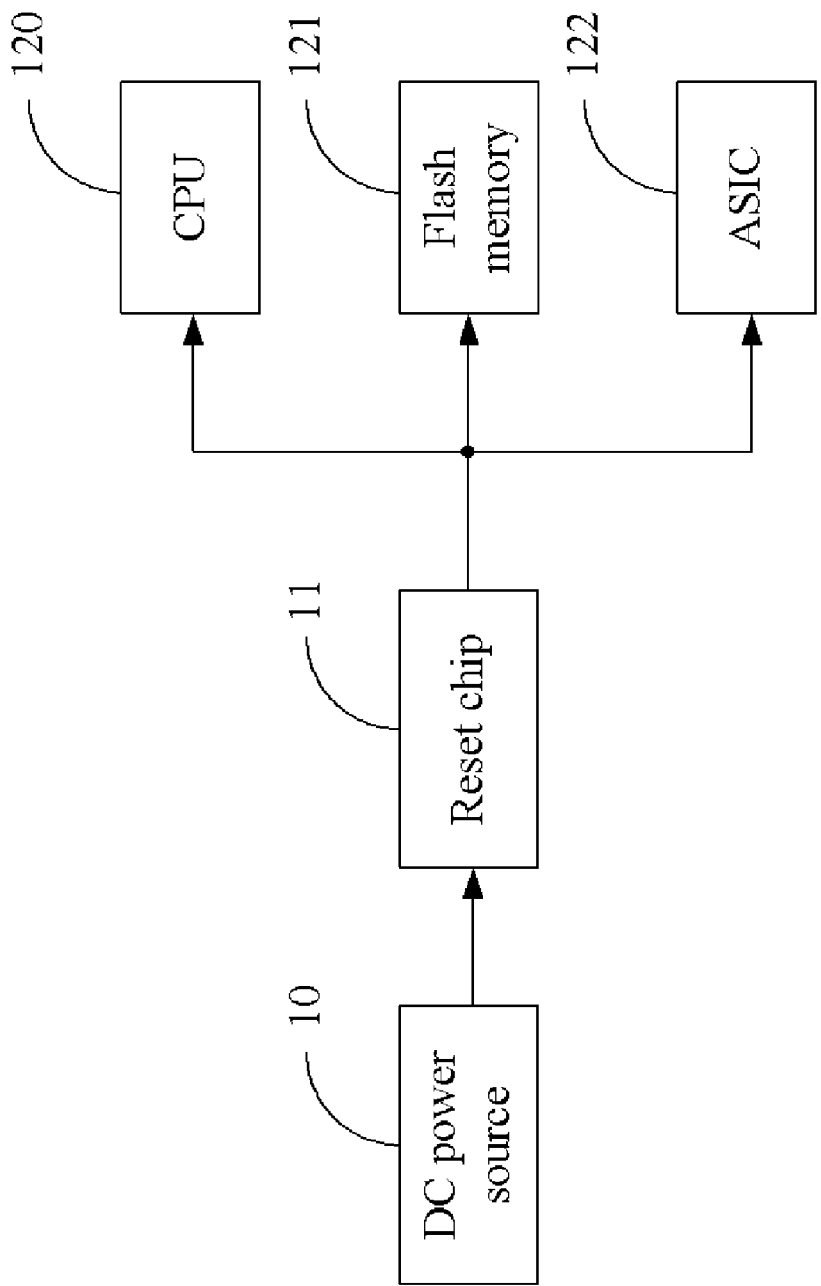
FIG. 4 is a block diagram of a power-on reset circuit.
Figure 5:
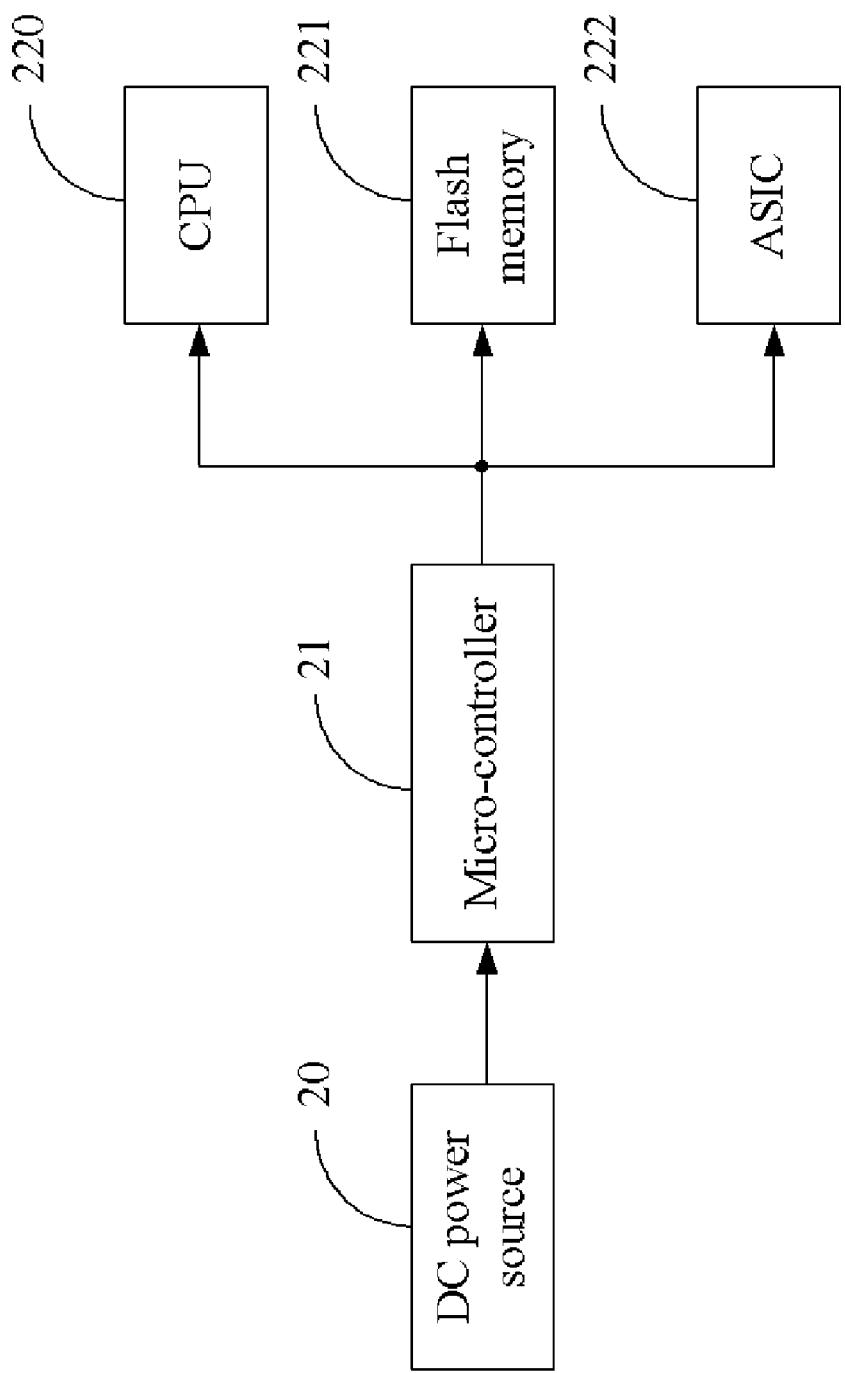
FIG. 5 is a block diagram of another power-on reset circuit.

Referring to diagrams (a), (b) and (c) in FIG. 3, at a starting moment (marked as 0 ms in FIG. 3), the power-on reset circuit 3 is powered on. An operation principle of the power-on reset circuit 3 is described as follows:

In diagram (a) of FIG. 3, a line V(A) shows a waveform of the first delaying reference signal, and a line V(U1) illustrates a waveform of the first rectified signal. In this embodiment, the first capacitor C1 is substantially instantaneously shorted when the DC power source 30 begins to supply power, and then the power signal from the DC power source 30 is directly loaded on the junction A of the first capacitor C1 and the first resistor R1. Under this circumstance, the first delaying reference signal is output from the junction A is substantially equal to the power signal. Because the voltage of the power signal is higher than the high voltage level of the first Schmitt circuit U1, the first Schmitt circuit U1 is triggered and outputs the first rectifying signal at a low voltage level.

Subsequently, the first capacitor C1 begins to charge and the voltage of the first delaying reference signal begins to decrease. At time T2, voltage of the first delaying reference signal decreases to the low voltage level of the Schmitt circuit U1, therefore the first Schmitt circuit U1 is not triggered, and outputs the first rectifying signal at a high voltage level. When the delaying reference signal inputting as a high level, the first rectified signal is output form high voltage level to low voltage level.

In diagram (b) of FIG. 3, a line V(B) shows a waveform of the second delaying reference signal, and a line V(U2) illustrates a waveform of the second rectified signal. The principle of the second delay unit 312 is opposite to that of the first delay unit 311. In this embodiment, the first capacitor C2 is substantially instantaneously shorted and the power signal flows to ground when the DC power source 30 begins supplying power, therefore the second delaying reference signal that a common node B of the second capacitor C2 and the second resistor R2 outputs is zero. Because the high voltage level is the trigger voltage, the second Schmitt circuit U2 is not triggered and the second rectified signal at the high voltage level is output.

Subsequently, the second capacitor C2 opens the circuit between the power source and ground and begins to be charged. The power source loads on the junction B, so the voltage of the second delaying reference signal begins to increase until time T1. At T1, the second delaying reference signal increases to the high voltage level of the Schmitt circuit U2, therefore the second Schmitt circuit U2 is triggered, and then outputs the second rectifying signal at low voltage level outputs. When the delaying reference signal inputting as a low level, the first rectified signal is output form low voltage level to high voltage level.

Diagram (c) of FIG. 3 is a signal reset oscillogram showing the first rectified signal and the second rectified signal, and the line V (OUT) illustrates the reset signal waveform of the logic operation output. Before T1, the first rectifying unit 321 outputs the first rectified signal at the low voltage level to the first diode D1, the second rectifying unit 322 outputs the second rectified signal at the high voltage level to the second diode D2. Therefore the first diode D1 is cut-off by the first logic signal, which is the low voltage level signal. At this moment, the second diode D2 is on, and the second logic signal is the high voltage level signal, and so the logic operation circuit 33 outputs the second logic signal at high voltage level.

Between T1-T2, the first rectifying unit 321 outputs the first low voltage level rectified signal to the first diode D1 and the second rectifying unit 322 outputs the second low voltage level rectified signal to the second diode D2, therefore both of the first diode D1 and the second diode D2 are cut-off, and the logic operation circuit 33 outputs a low voltage level signal.

After T2, the first rectifying unit 321 outputs the first high voltage level rectified signal to the first diode D1 and the second rectifying unit 322 outputs the second low voltage level rectified signal to the second diode D2, therefore the first diode D1 is on and the first logic signal is high. Meanwhile, the second diode D2 is cut-off, and the second logic operation is low voltage level and the first logic signal makes the logic operation circuit 33 outputs the high voltage level signal.

In the exemplary illustrated embodiment, T1 is about 4 ms after power-on and T2 is about 11 ms after power-on.

The logic operation circuit 33 logic OR gate operate via the first rectified signal and the second signal to generate a reset signal from high voltage level to low voltage level and then from low voltage level to high voltage level that complete the reset of the chipset 34. The power-on reset circuit 3 generates the reset signal to reset the chipset 34 though two delay circuit 31, two rectifying circuit 32, and the logic operation circuit 33.

Although the features and elements of the present disclosure are described in various inventive embodiment in particular combinations, each feature or element can be configured alone or in various within the principles of the present disclosure to the full extent indicated by the broad general meaning of the terms in which the appended claims are expressed.

What is claimed is:

1. A power-on reset circuit connected between an external DC power source and at least one functional chip for generating reset signals, the power-on reset circuit comprising:
a delay circuit, comprising:
a first delay unit used for delaying a first power signal received from the external DC power source to output a first delaying reference signal according to the first power signal, the first delay unit comprising a first capacitor and a first resistor connected in series between the external DC power source and ground; and
a second delay unit used for delaying a second power signal received from the external DC power source to output a second delaying reference signal according to the second power signal, the second delay unit comprising a second capacitor and a second resistor connected in series between the external DC power source and ground;
a rectifying circuit connected to the delay circuit, comprising:
a first rectifying unit connected to the first delay unit for rectifying the first delaying reference signal to output a first rectified signal;
a second rectifying unit connected to the second delay unit for rectifying the second delaying reference signal to output a second rectified signal; and
a logic operation circuit connected to the rectifying circuit used for outputting a reset signal according to the first rectified signal and the second rectified signal.

2. The power-on reset circuit as claimed in claim 1, wherein the first rectifying unit comprises a first Schmitt circuit having a first input connected to a junction of the first capacitor and the first resistor and a first output connected to the logic operation circuit.

3. The power-on reset circuit as claimed in claim 2, wherein the second rectifying unit comprises a second Schmitt circuit having a second input connected to a junction of the second capacitor and the second resistor and a second output connected to the logic operation circuit.

4. The power-on reset circuit as claimed in claim 3, wherein the logic operation circuit comprises a first diode having an anode of the first diode being connected to the first output of the first Schmitt circuit component for receiving the first rectified signal and a cathode of the first diode being used for outputting a first logic signal.

5. The power-on reset circuit as claimed in claim 4, wherein the logic operation circuit further comprises a second diode having an anode of the second diode is connected to the second output of the second Schmitt circuit component for receiving the second rectified signal and a cathode of the second diode being used for outputting a second logic signal.

6. The power-on reset circuit as claimed in claim 1, wherein the logic operation circuit is an OR-gate circuit.

7. An electronic device connected to an external DC power source, the electronic device comprising:
a chipset; and
a power-on reset circuit, comprising:
a delay circuit, comprising:
a first delay unit used for delaying a signal received from the external DC power source to output a first delaying reference signal, the first delay unit comprising a first capacitor and a first resistor, sequentially connected in series between the external DC power source and a ground; and
a second delay unit used for delaying a signal received from the external DC power source to output a second delaying reference signal, the second delay unit comprises a second capacitor and a second resistor, sequentially connected in series between the external DC power source and the ground;
a rectifying circuit connected to the delay circuit, comprising:
a first rectifying unit connected to the first delay unit used for rectifying the first delaying reference signal to output a first rectified signal;
a second rectifying unit connected to the second delay unit used for rectifying the second delaying reference signal to output a second rectified signal; and
a logic operation circuit connected to the rectifying circuit used for outputting a reset signal according to the first rectified signal and the second rectified signal.

8. The electronic device circuit as claimed in claim 7, wherein the first rectifying unit comprises a first Schmitt circuit having a first input connected to a junction of the first capacitor and the first resistor and a first output connected to the logic operation circuit.

9. The electronic device circuit as claimed in claim 8, wherein the second rectifying unit comprises a second Schmitt circuit having a second input connected to a junction of the second capacitor and the second resistor and a second output connected to the logic operation circuit.

10. The electronic device circuit as claimed in claim 9, wherein the logic operation circuit comprises a first diode having an anode of the first diode being connected to the first output of the first Schmitt circuit component for receiving the first rectified signal and a cathode of the first diode being used for outputting a first logic signal.

11. The electronic device circuit as claimed in claim 10, wherein the logic operation circuit further comprises a second diode having an anode of the second diode is connected to the second output of the second Schmitt circuit component for receiving the second rectified signal and a cathode of the second diode being used for outputting a second logic signal.

12. The electronic device circuit as claimed in claim 7, wherein the logic operation circuit is an OR-gate circuit.

* * * * *